United States Patent
Seh et al.

(10) Patent No.: US 7,838,419 B2
(45) Date of Patent: Nov. 23, 2010

(54) SYSTEMS AND METHODS TO LAMINATE PASSIVES ONTO SUBSTRATE

(75) Inventors: Huankiat Seh, Phoenix, AZ (US); Yongki Min, Phoenix, AZ (US); Islam A. Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 918 days.

(21) Appl. No.: 11/642,350

(22) Filed: Dec. 20, 2006

(65) Prior Publication Data

US 2008/0148560 A1    Jun. 26, 2008

(51) Int. Cl.
    *H01L 21/44*    (2006.01)
(52) U.S. Cl. .................. 438/666; 438/557; 29/841
(58) Field of Classification Search ............... 438/666, 438/557; 29/841
    See application file for complete search history.

(56) References Cited

U.S. PATENT DOCUMENTS

| 4,466,181 A | * | 8/1984 | Takishima ............... 438/107 |
| 5,161,093 A | * | 11/1992 | Gorczyca et al. ........... 361/795 |
| 5,225,023 A | * | 7/1993 | Wojnarowski et al. ...... 156/298 |
| 5,291,066 A | * | 3/1994 | Neugebauer et al. ........ 257/750 |
| 6,838,750 B2 | * | 1/2005 | Nuytkens et al. ............ 257/666 |

* cited by examiner

*Primary Examiner*—Thinh T Nguyen
(74) *Attorney, Agent, or Firm*—Buckley, Maschoff & Talwalkar LLC

(57) ABSTRACT

A method may include depositing a dielectric layer onto a substrate, removing portions of the dielectric layer to create a plurality of separated non-removed portions of the dielectric layer, depositing one or more passive electronic components into each of the plurality of separated non-removed portions, and curing the separated non-removed portions of the dielectric layer.

5 Claims, 7 Drawing Sheets

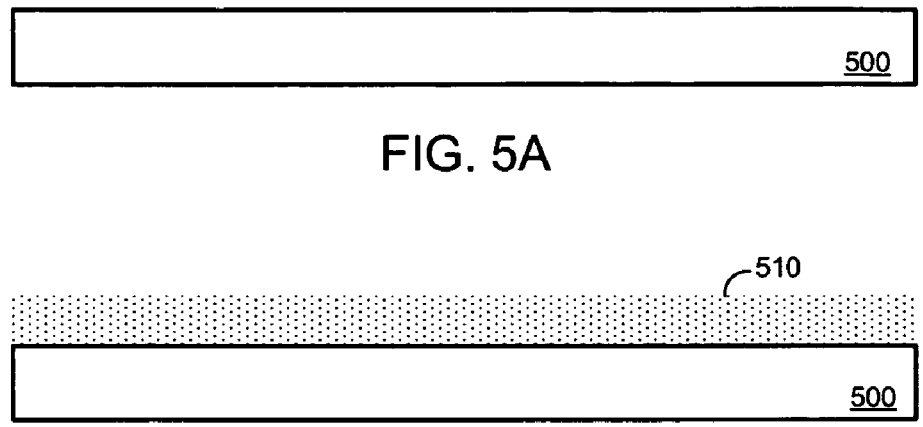
FIG. 5A
FIG. 5B
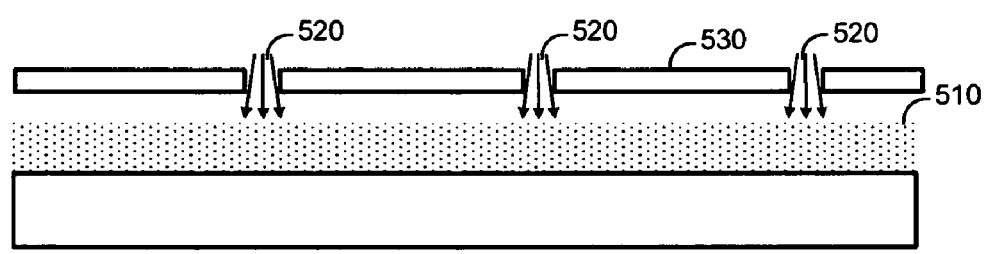
FIG. 5C
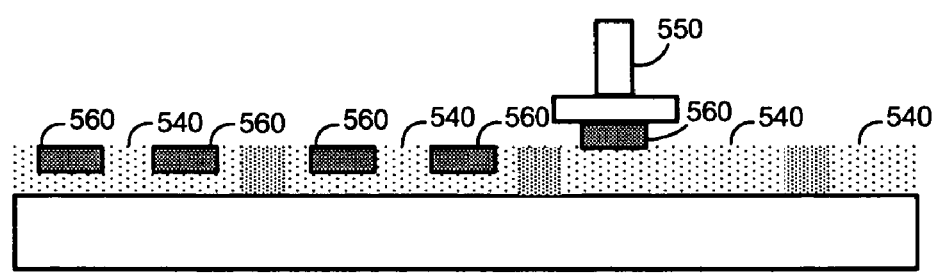
FIG. 5D
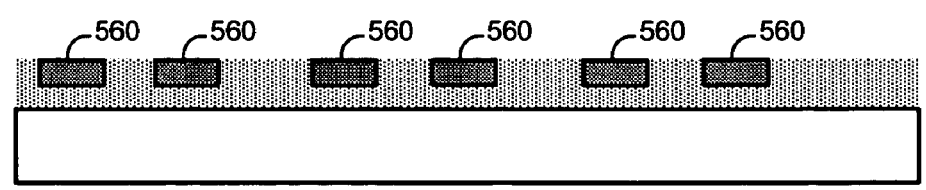
FIG. 5E

SYSTEMS AND METHODS TO LAMINATE PASSIVES ONTO SUBSTRATE

BACKGROUND

Preformed passive electrical components may be embedded within an integrated circuit (IC) substrate in order to provide decoupling, RF tuning or voltage regulation. Such components must be electrically connected to conductive traces formed within the substrate.

FIGS. 1A through 1D illustrate a conventional method to embed passive components within an IC substrate. Substrate 100 is shown at FIG. 1 and may comprise an organic substrate having any number of conductive and dielectric layers. Dielectric layer 110 is placed on substrate 100 as shown in FIG. 1B, and passive components 120 are placed into dielectric layer 110 at desired positions as shown in FIG. 1C. When located at the desired positions, passive components 120 are electrically connected to appropriate traces of substrate 100. Dielectric layer 110 is then cured, which causes layer 110 to shrink and components 120 to thereby move away from their desired positions. This movement may disconnect components 120 from appropriate conductive traces of substrate 100.

BRIEF DESCRIPTION OF THE DRAWINGS

FIGS. 5A through 5E illustrate some embodiments of the FIG. 4 process.

DETAILED DESCRIPTION

Figure 2:
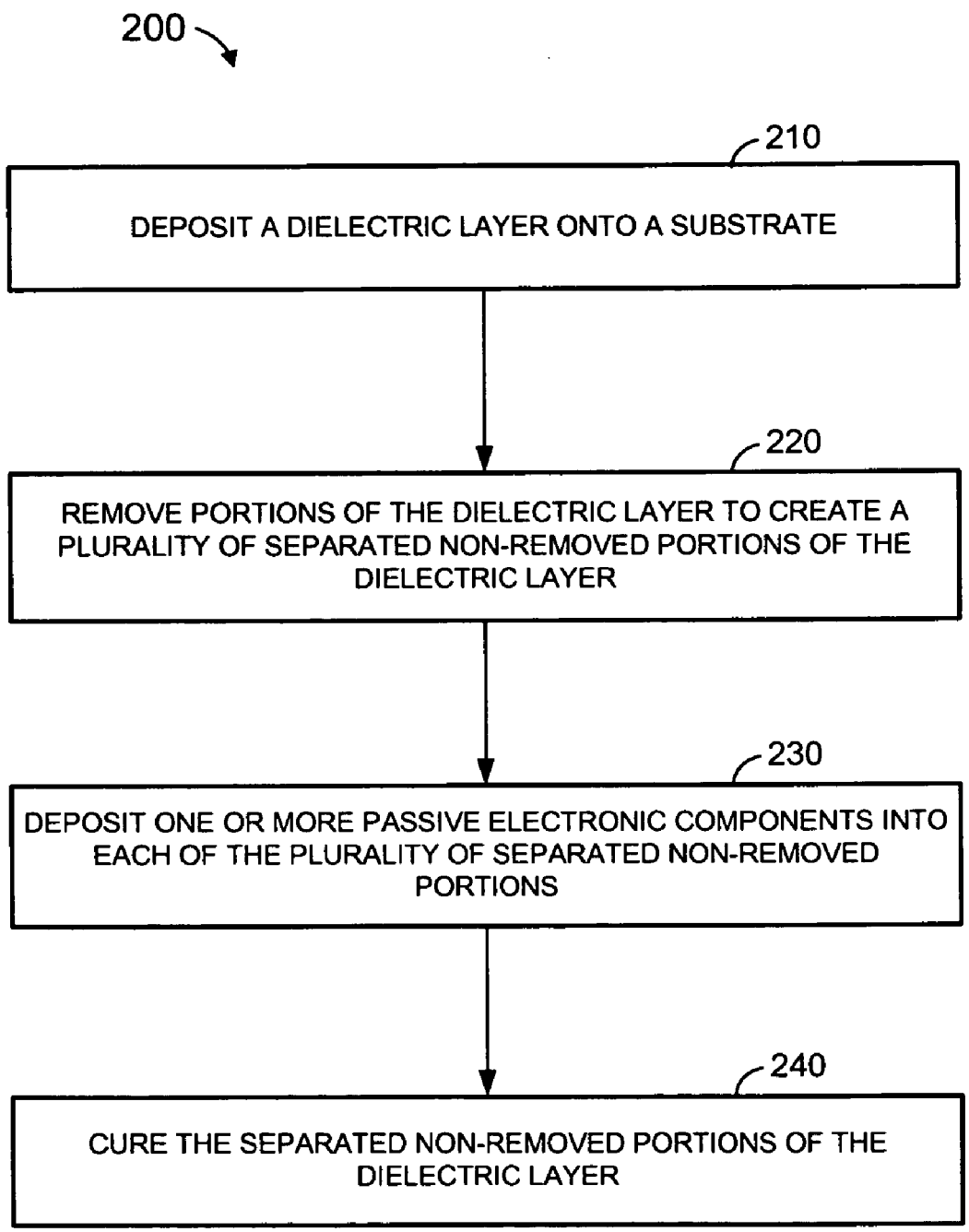
FIG. 2 is a diagram of a process according to some embodiments.

FIG. 2 is a diagram of process 200 to fabricate an apparatus according to some embodiments. Process 200 and each other process described herein may be executed by one or more fabrication devices, and all or a part of these processes may be executed manually. These processes 200 may be executed by an entity different from an entity that manufactures an IC die to which the fabricated apparatus is subsequently coupled.

A dielectric layer is initially deposited on a substrate at 210. The substrate may comprise any ceramic, organic, and/or other suitable material. The substrate may comprise any portion of an IC package substrate, including but not limited to a core, metallization layers and/or other dielectric layers. Accordingly, the dielectric layer may be deposited upon any suitable layer of a substrate at 210.

Figure 3A:
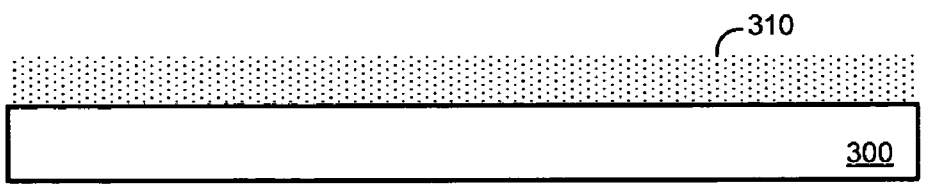
FIGS. 3A through 3E illustrate some embodiments of the FIG. 2 process.
Figure 3B:
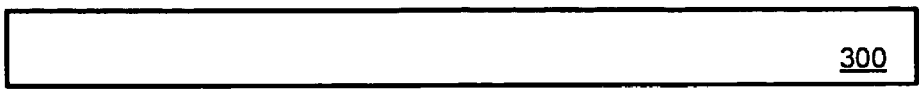

FIGS. 3A and 3B are side cross-sectional views showing substrate 300 and dielectric layer 310 deposited on substrate 300, respectively. Substrate 300 may be composed of any suitable material, including but not limited to bismalemide triazine (BT) and FR4. According to some embodiments, substrate 300 (and any other substrate referred to herein) may comprise a core layer with any number of build-up layers attached thereto. The build-up layers may comprise dielectric material and conductive interconnect traces. Dielectric layer 310 may comprise any suitable dielectric and may be deposited in any manner that is or becomes known. In some embodiments, dielectric layer 310 comprises B-stage Ajinomoto Build-up Film. Dielectric layer 310 may be uncured or partially cured prior to being deposited on substrate 300 according to some embodiments. Substrate 300 and dielectric layer 310 may be panel-sized and may therefore include elements of multiple IC package substrates.

Figure 3C:
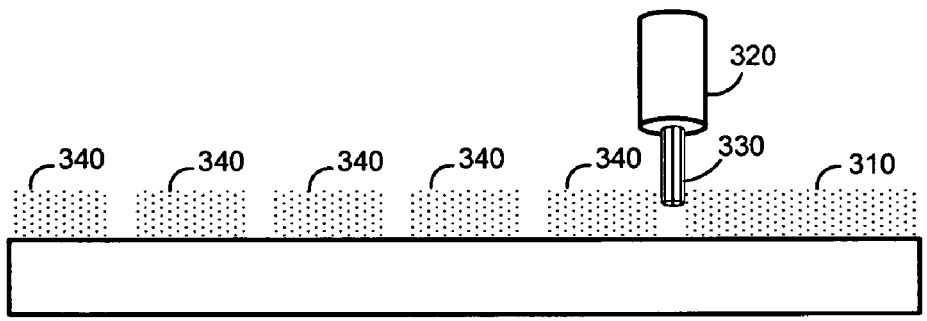

Next, at 220, portions of the dielectric layer are removed to create a plurality of separated non-removed portions of the dielectric layer. FIG. 3C illustrates 220 according to some embodiments. Specifically, laser drill 320 directs laser beam 330 toward appropriate locations of dielectric layer 310 in order to laser-scribe a plurality of separated non-removed portions 340. Laser scribing as shown removes portions of dielectric layer 310 that reside between non-removed portions 340. Laser drill 320 may comprise a conventional tool for creating substrate vias.

Figure 3D:
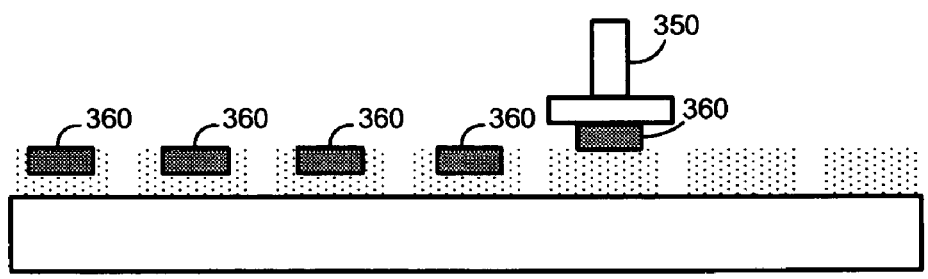

One or more passive electronic components are then deposited into each of the non-removed portions at 230. Any system to deposit the components may be utilized at 230, including but not limited to surface mounter 350 of FIG. 3D. Passive components 360 may comprise any suitable electrical component, such as a capacitor or an inductor. Components 360 may be deposited at 230 in alignment with conductive traces of substrate 300 to which components 360 are intended to be coupled.

Figure 3E:
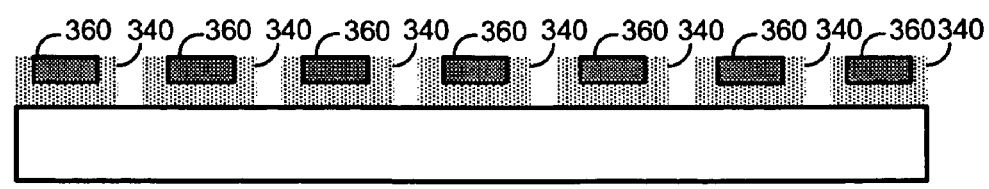

Next, at 240, the separated non-removed portions of the dielectric layer are cured. FIG. 3E illustrates cured separated non-removed portions 340 of dielectric layer 310. According to some embodiments, curing separated non-removed portions 340 results in less movement of components 360 than exhibited by prior systems. In this regard, some remnants of dielectric layer 310 may remain between the plurality of separated non-removed portions after 220, but the remnants do not substantially affect the shrinkage of adjacent non-removed portions.

Subsequent processing may include depositing a next dielectric layer onto dielectric layer 310, via formation, and/or patterning. Substrate 300 may be singulated to separate each non-removed portion into individual IC package substrates.

Figure 4:
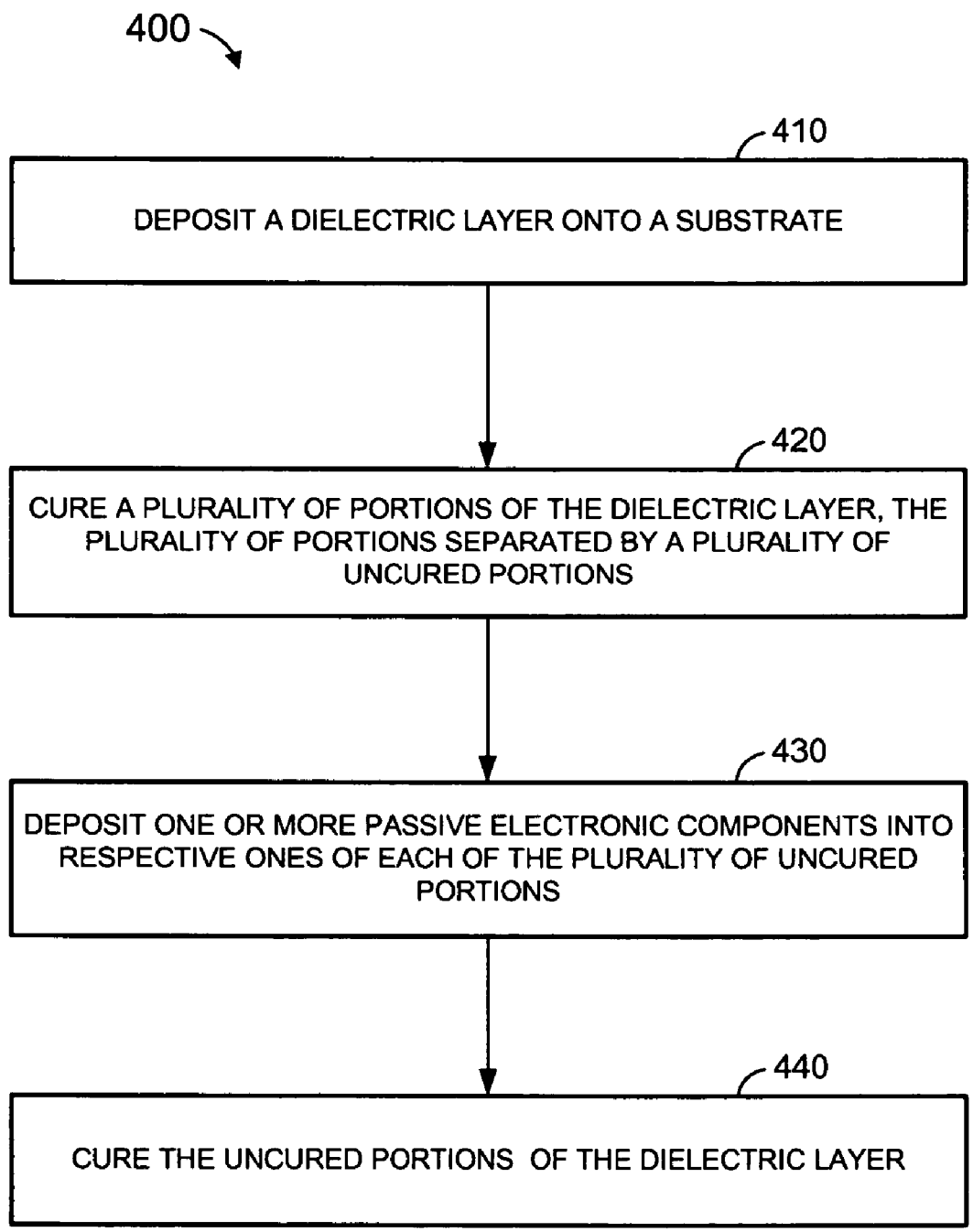
FIG. 4 is a diagram of a process according to some embodiments.

Process 400 of FIG. 4 also initially involves depositing a dielectric layer on a substrate. The substrate and the dielectric may comprise any of the implementations described with respect to process 200. FIGS. 5A and 5B depict deposition of the dielectric layer onto a substrate at 410 according to some embodiments.

A plurality of portions of the dielectric layer are cured at 420. The plurality of portions are separated by a plurality of non-cured portions. FIG. 5C illustrates curing according to some embodiments of 420. As shown, energy 520 is directed to portions of dielectric layer 510 using mask 530. Energy 520 may be delivered by any energy source suitable for curing dielectric layer 510, including but not limited to a laser, ultraviolet light, microwaves, etc. FIG. 5D shows uncured portions 540 of dielectric layer 510.

Figure 1A:
FIGS. 1A through 1D illustrate fabrication of an apparatus.
Figure 1B:
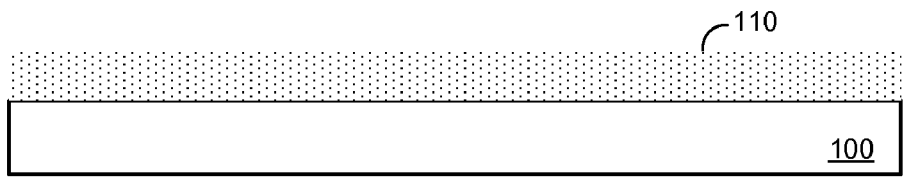
Figure 1C:
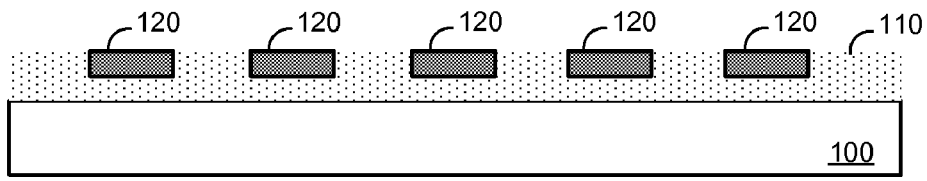
Figure 1D:
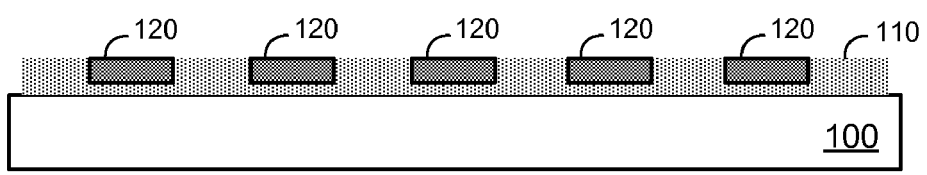

One or more passive electronic components are then deposited into each of the uncured portions at 430. Although any system may deposit the components at 430, FIG. 5D illustrates the use of surface mounter 550 to deposit components 560. Uncured portions 540 are then cured at 440. Since any one contiguous uncured portion may be smaller than that shown in FIG. 1C, components 560 may experience less movement during curing than in prior systems. Again, any suitable additional processing may be performed after 440.

Figure 6:
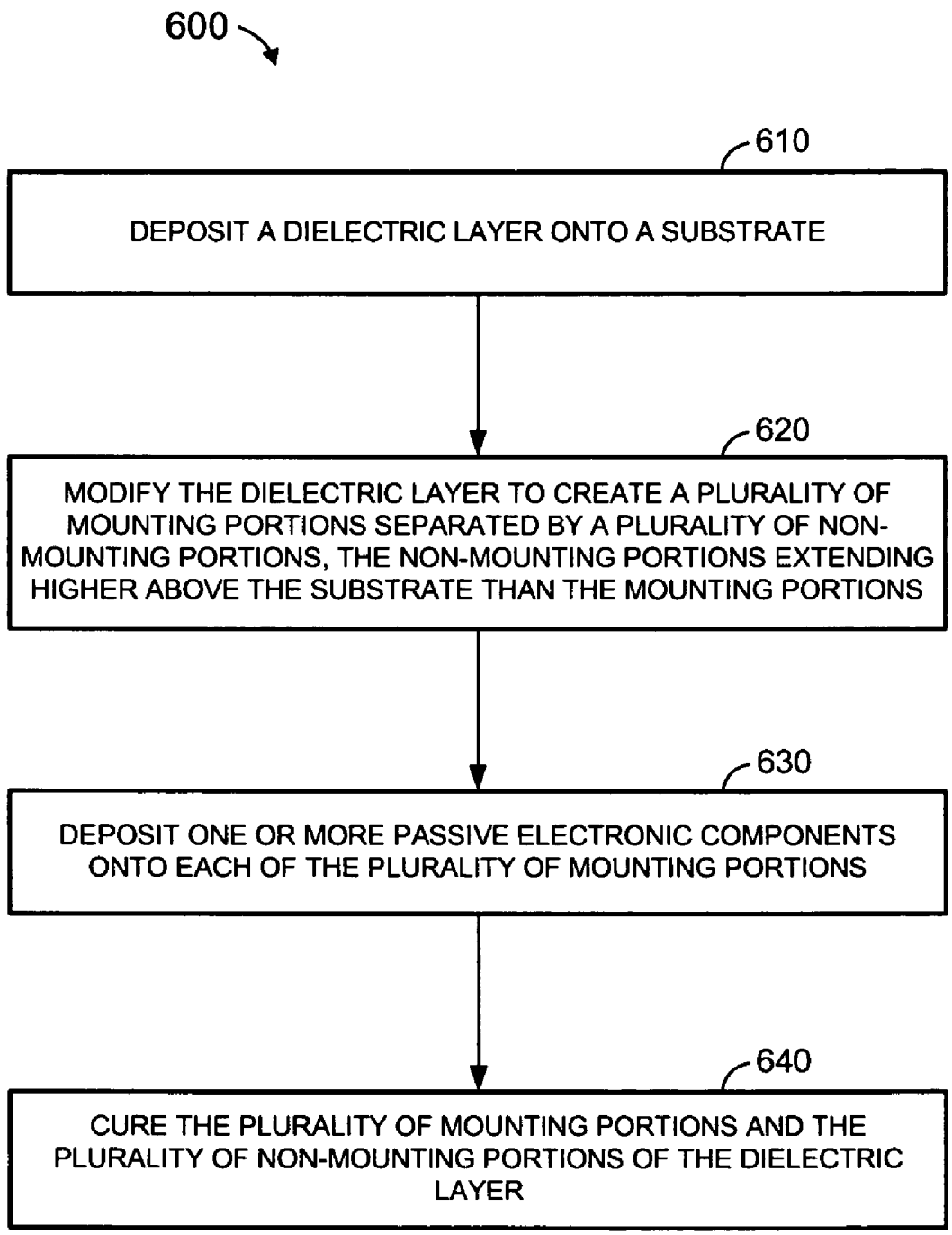
FIG. 6 is a diagram of a process according to some embodiments.
Figure 7A:
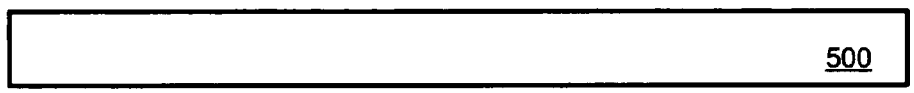
FIGS. 7A through 7E illustrate some embodiments of the FIG. 6 process.
Figure 7B:
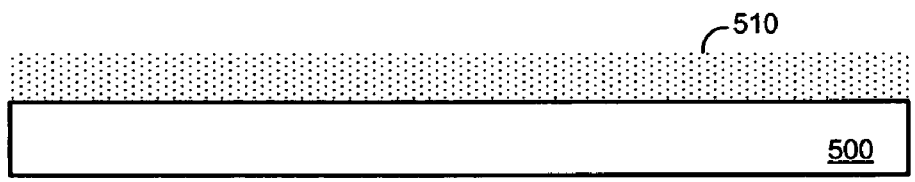

FIG. 6 illustrates process 600 according to some embodiments. A dielectric layer is deposited on a substrate at 610, as illustrated in FIGS. 7A and 7B. The dielectric layer is modified at 620 to create a plurality of mounting potions. The plurality of mounting portions are separated by a plurality of non-mounting portions which extend higher above the substrate than the mounting portions.

Figure 7C:
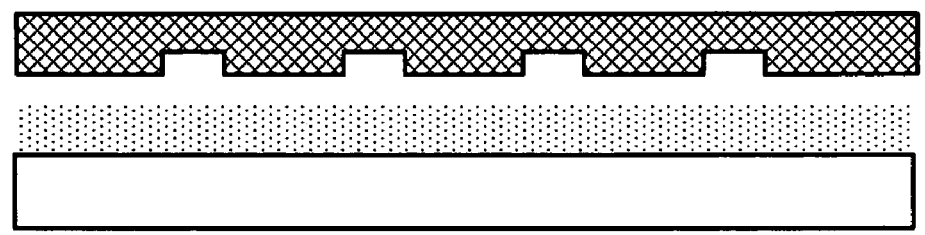
Figure 7D:
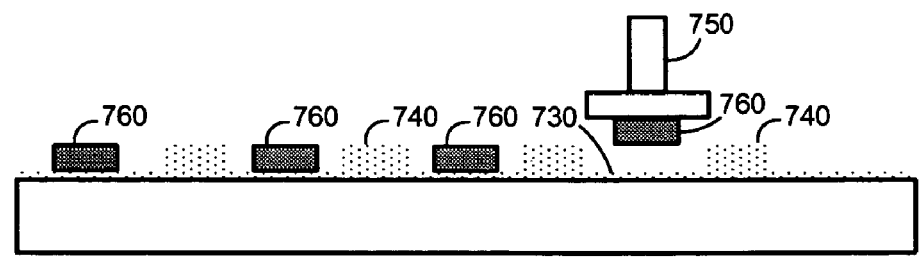

FIGS. 7C and 7D illustrate modification of dielectric layer 710 at 620 according to some embodiments. As shown, tool 720 is biased against dielectric layer 720 in order to compress mounting portions 730 located between non-mounting portions 740. In some embodiments, dielectric layer 710 is molded to create the structure illustrated in FIG. 7D.

Figure 7E:
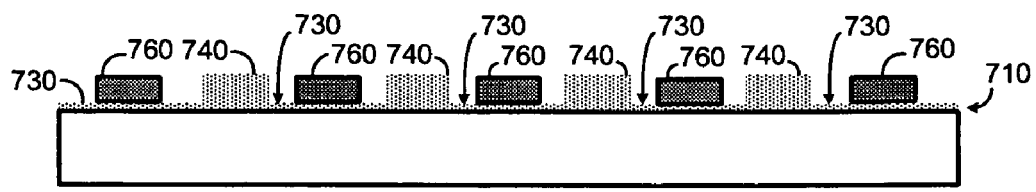

One or more passive electronic components are then deposited into each of the plurality of mounting portions at 630. FIG. 7D shows surface mounter 750 depositing components 760 onto mounting portions 730. The entire dielectric layer, consisting of the plurality of mounting portions and the plurality of non-mounting portions, is then cured at 640. According to some embodiments, such as the FIG. 7E embodiment, the low profile of the plurality of mounting portions 730 with respect to the plurality of non-mounting portions 740 results in less movement of components 760 due to curing of dielectric layer 710.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. A method comprising:
    depositing a dielectric layer onto a substrate;
    removing portions of the dielectric layer to create a plurality of separated non-removed portions of the dielectric layer;
    depositing one or more passive electronic components into each of the plurality of separated non-removed portions; and
    curing the separated non-removed portions of the dielectric layer.

2. A method according to claim 1, wherein removing the portions comprises:
    laser scribing the plurality of separated non-removed portions.

3. A method according to claim 1, further comprising:
    singulating the substrate,
    wherein the substrate comprises a panel comprising a plurality of integrated circuit dice.

4. A method according to claim 1, further comprising:
    depositing a second dielectric layer onto the dielectric layer.

5. A method according to claim 1, wherein the dielectric layer is partially cured before being deposited on the substrate.

* * * * *